United States Patent
Kim et al.

(10) Patent No.: US 12,482,789 B2
(45) Date of Patent: Nov. 25, 2025

(54) SEMICONDUCTOR PACKAGE

(71) Applicant: SAMSUNG ELECTRONICS CO., LTD., Suwon-si (KR)

(72) Inventors: Buwon Kim, Suwon-si (KR); Sangsub Song, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 314 days.

(21) Appl. No.: 18/116,011

(22) Filed: Mar. 1, 2023

(65) Prior Publication Data

US 2023/0395568 A1 Dec. 7, 2023

(30) Foreign Application Priority Data

Jun. 2, 2022 (KR) ................ 10-2022-0067448

(51) Int. Cl.
*H01L 25/065* (2023.01)
*H01L 23/00* (2006.01)
*H01L 23/31* (2006.01)

(52) U.S. Cl.
CPC ...... *H01L 25/0657* (2013.01); *H01L 23/3128* (2013.01); *H01L 24/48* (2013.01); *H01L 2224/48145* (2013.01); *H01L 2224/48227* (2013.01); *H01L 2224/48465* (2013.01); *H01L 2224/48471* (2013.01); *H01L 2225/06506* (2013.01); *H01L 2225/0651* (2013.01); *H01L 2225/06562* (2013.01)

(58) Field of Classification Search
CPC .............. H01L 2225/06562; H01L 24/49
See application file for complete search history.

(56) References Cited

U.S. PATENT DOCUMENTS

| | | | |
|---|---|---|---|
| 6,707,164 B2 | 3/2004 | Cheng et al. | |
| 6,812,580 B1 | 11/2004 | Wenzel et al. | |
| 6,927,096 B2 | 8/2005 | Shimanuki | |
| 7,298,040 B2 | 11/2007 | Cornelius | |
| 7,667,321 B2 | 2/2010 | Rebelo et al. | |
| 7,675,168 B2 | 3/2010 | Appel et al. | |
| 8,018,035 B2 | 9/2011 | Tanaka | |
| 2022/0139879 A1* | 5/2022 | Park | H01L 25/0657 257/777 |
| 2022/0189914 A1* | 6/2022 | Park | H01L 24/48 |
| 2024/0312890 A1* | 9/2024 | Boo | H01L 24/48 |

* cited by examiner

*Primary Examiner* — Yu-Hsi D Sun
(74) *Attorney, Agent, or Firm* — Sughrue Mion, PLLC (57) ABSTRACT

In some embodiments, a semiconductor package includes a package substrate that includes a first surface, a second surface that is opposite to the first surface, first substrate pads disposed on the first surface in a first row, and second substrate pads disposed on the first surface in a second row. The semiconductor package further includes a first semiconductor chip that includes first chip pads, lower bonding wires configured to respectively couple the first chip pads and the first substrate pads, a second semiconductor chip that includes second chip pads, upper bonding wires configured to respectively couple the second chip pads and the second substrate pads, and an encapsulant disposed on the package substrate and covering the first semiconductor chip and the second semiconductor chip. The lower bonding wires are ball-bonded to the first chip pads and stich-bonded to the first substrate pads.

17 Claims, 7 Drawing Sheets

SEMICONDUCTOR PACKAGE

CROSS-REFERENCE TO RELATED APPLICATIONS

This application claims benefit of priority under 35 U.S.C. § 119 to Korean Patent Application No. 10-2022-0067448, filed on Jun. 2, 2022, in the Korean Intellectual Property Office, the disclosure of which is incorporated herein by reference in its entirety.

BACKGROUND

1. Field

The present disclosure relates generally to semiconductor packages, and more particularly, to semiconductor packages with stacked semiconductor chips.

2. Description of Related Art

With the development of the electronics industry, demand for high-functionality, high-speed, and miniaturization of electronic components has increased. In line with this trend, a semiconductor packaging method of stacking and mounting semiconductor chip stacks including several semiconductor chips has increasingly been used. In related semiconductor packages with stacked semiconductor chip stacks, a loop shape of bonding wires connected to ground/power pads and/or input/output pads of the semiconductor chip stacks stacked thereon may cause crosstalk between signals of adjacent bonding wires, and result in deterioration of the signals transmitted through the bonding wires.

Thus, there exists a need for further improvements in related semiconductor packages with stacked semiconductor chip stacks.

SUMMARY

An aspect of the present disclosure provides a semiconductor package in which deterioration of a signal transmitted through a bonding wire is reduced.

According to an aspect of the present disclosure, a semiconductor package is provided. The semiconductor package includes a package substrate, a first semiconductor chip, lower bonding wires, a second semiconductor chip, upper bonding wires, and an encapsulant. The package substrate includes a first surface, a second surface that is opposite to the first surface, first substrate pads disposed on the first surface in a first row, and second substrate pads disposed on the first surface in a second row. The second row is parallel to the first row in a first direction. The first semiconductor chip is disposed on the first surface of the package substrate, and includes first chip pads. The lower bonding wires are configured to respectively couple the first chip pads and the first substrate pads. The lower bonding wires are ball-bonded to the first chip pads and are stich-bonded to the first substrate pads. The second semiconductor chip is disposed on the first semiconductor chip and includes second chip pads. The upper bonding wires are configured to respectively couple the second chip pads and the second substrate pads. The upper bonding wires are stich-bonded to the second chip pads and are ball-bonded to the second substrate pads. The encapsulant is disposed on the package substrate and covers the first semiconductor chip and the second semiconductor chip. The upper bonding wires include first upper bonding wires and second upper bonding wires alternately disposed in the first direction. The second upper bonding wires are coupled to the second substrate pads in a coupling position that is closer to the first semiconductor chip than to the first upper bonding wires. The second chip pads include a ground/power pad and an input/output pad. The first upper bonding wires are coupled to the ground/power pad. The second upper bonding wires are coupled to the input/output pad. The input/output pad is configured to input a first single-ended signal and output a second single-ended signal.

According to an aspect of the present disclosure, a semiconductor package is provided. The semiconductor package includes a package substrate, a first semiconductor stack, a second semiconductor stack, lower bonding wires, upper bonding wires, and an encapsulant. The package substrate includes a first surface, a second surface that is opposite to the first surface, first substrate pads disposed on the first surface in a first row, and second substrate pads disposed on the first surface in a second row that is parallel to the first row in a first direction. The first semiconductor stack is disposed on the first surface of the package substrate, and includes at least two first semiconductor chips stacked in a step shape. Each of the at least two first semiconductor chips have first chip pads disposed adjacently in one side edge of each of the at least two first semiconductor chips. The second semiconductor stack is disposed on the first semiconductor stack, and includes at least two second semiconductor chips stacked in a step shape, and has an overhang region protruding outwardly of an uppermost first semiconductor chip of the first semiconductor stack in a direction perpendicular to the first substrate of the package substrate. The at least two second semiconductor chips have second chip pads disposed adjacently in one side edge of each of the at least two second semiconductor chips. The lower bonding wires are configured to couple the package substrate to a lowermost first semiconductor chip of the first semiconductor stack. The upper bonding wires are configured to couple the package substrate to a lowermost second semiconductor chip of the second semiconductor stack. The encapsulant is disposed on the package substrate and covers the first semiconductor stack and the second semiconductor stack. The upper bonding wires include a first group and a second group alternately disposed with each other. The second group is coupled to the second substrate pads in a coupling position that is closer to the first semiconductor stack than to the first group. The second chip pads include a ground/power pad and an input/output pad. The first group is coupled to the ground/power pad. The second group is coupled to the input/output pad.

According to an aspect of the present disclosure, a semiconductor package is provided. The semiconductor package includes a package substrate, a semiconductor chip, and bonding wires. The package substrate has substrate pads disposed on one surface of the package substrate in at least two rows that are parallel to each other in a first direction. The semiconductor chip is disposed on the one surface of the package substrate. The semiconductor chip has chip pads. The bonding wires respectively connect the chip pads and the substrate pads. The bonding wires include first bonding wires and second bonding wires alternately disposed in the first direction. The second bonding wires are coupled to the substrate pads in a coupling position that is closer to the semiconductor chip than to the first bonding wires. Each of the first bonding wires extends from the substrate pads upwardly, and is sequentially bent toward the semiconductor chip with respect to the one surface, at a first angle in a first position, at a second angle in a second position, and at a third angle in a third position. Each of the second bonding wires extends from the substrate pads upwardly, and is sequentially bent toward the semiconductor chip with respect to the one surface, at a fourth angle in a fourth position, at a fifth angle in a fifth position, and at a sixth angle in a sixth position. A first level of the first position is substantially equal to a fourth level of the fourth position. A third level of the third position is substantially equal to a sixth level of the sixth position. A second level of the second position is lower than a fifth level of the fifth position. An upper surface of the semiconductor chip is spaced apart from the one surface of the package substrate by at least 800 µm.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

The following description with reference to the accompanying drawings is provided to assist in a comprehensive understanding of embodiments of the present disclosure defined by the claims and their equivalents. Various specific details are included to assist in understanding, but these details are considered to be exemplary only. Therefore, those of ordinary skill in the art will recognize that various changes and modifications of the embodiments described herein can be made without departing from the scope and spirit of the disclosure. In addition, descriptions of well-known functions and structures are omitted for clarity and conciseness.

With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wired), wirelessly, or via a third element.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

Hereinafter, example embodiments of the present disclosure are described with reference to the accompanying drawings.

Figure 1:
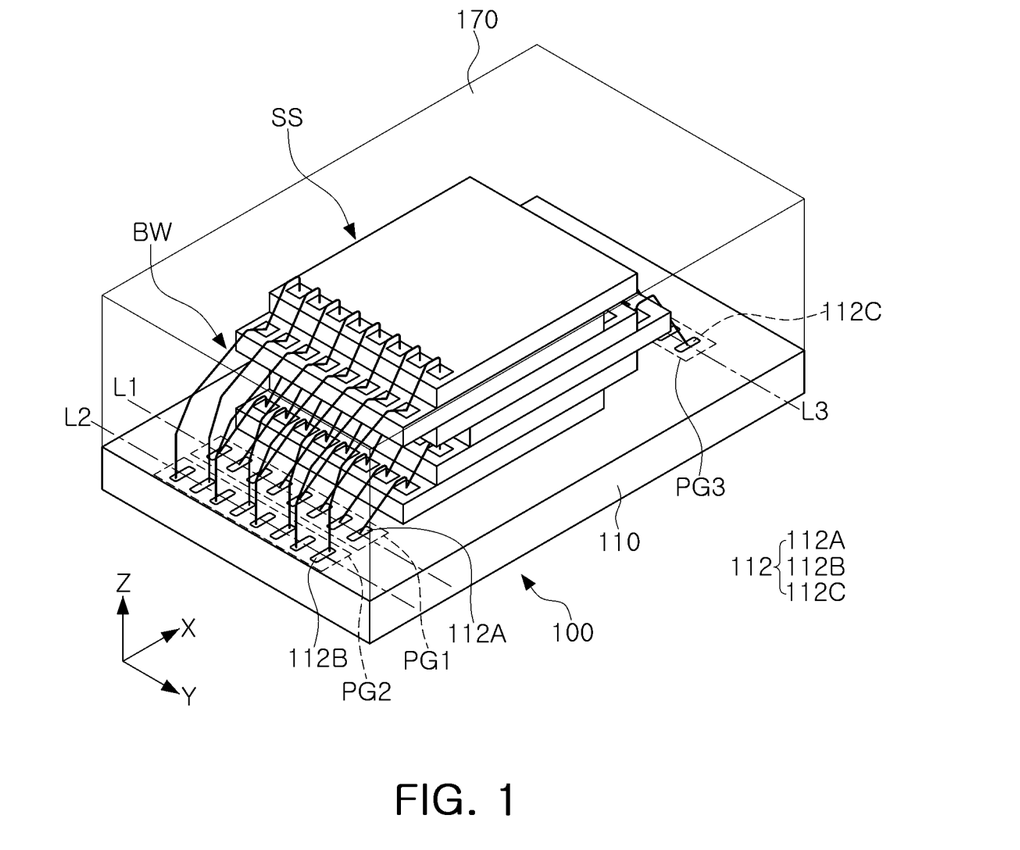
FIG. 1 is a perspective view of a semiconductor package according to an example embodiment of the present disclosure.
Figure 2:
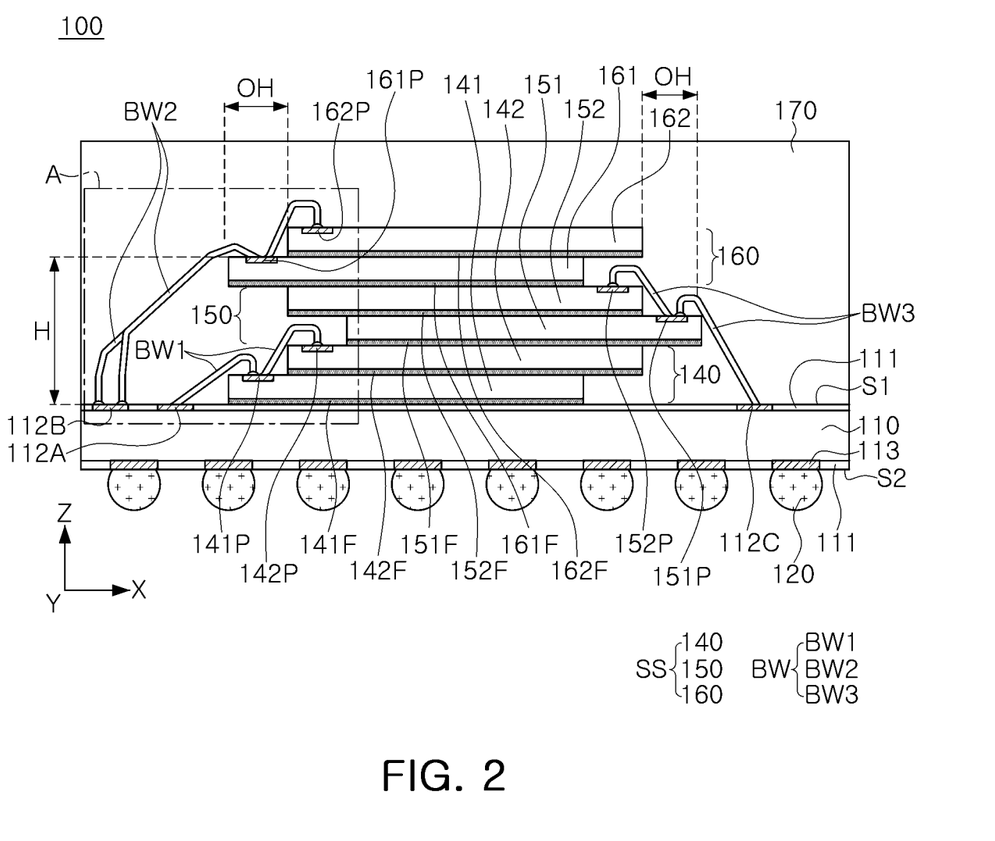
FIG. 2 is a side view of the semiconductor package as viewed in a Y-axis direction of FIG. 1.

Referring to FIGS. 1 and 2, a semiconductor package 100 may include a package substrate 110, a semiconductor stack SS, a bonding wire BW, and an encapsulant 170.

The package substrate 110 may have a plate shape having a first surface S1 and a second surface S2. For example, the package substrate 110 may be a printed circuit board (PCB) or a silicon (Si) interposer substrate. A substrate pad 112 may be disposed on the first surface S1 of the package substrate 110, and a bump pad 113 may be disposed on the second surface S2 of the package substrate 110. The package substrate 110 may have an internal interconnection (not shown) connecting the substrate pad 112 and the bump pad 113 included in the package substrate 110. The substrate pad 112 and the bump pad 113 may be patterned in a solder resist layer 111.

A plurality of substrate pads 112 may be disposed, and the substrate pads 112 may be disposed in groups on the first surface S1 of the package substrate 110. For example, as shown in FIGS. 1 and 2, the substrate pad 112 may be divided into first group PG1, second group PG2, and third group PG3 (hereinafter "groups PG", generally), and each of the groups PG may include corresponding substrate pads (e.g., first substrate pads 112A, second substrate pads 112B, and third substrate pads 112C, hereinafter "substrate pads 112" generally). It will be understood that the number of groups and/or substrate pads illustrated in FIGS. 1 and 2 are an example, and that the number of groups and/or substrate pads may be variously modified without deviating from the scope of the present disclosure. Each of the groups PG may be disposed in a first direction (e.g., Y direction) and may be disposed along corresponding virtual straight lines (e.g., virtual straight line L1, virtual straight line L2, and virtual straight line L3, hereinafter "virtual straight lines L", generally). The virtual straight lines L may be parallel to each other. For example, the first group PG1 and the second group PG2 may be disposed on one side of the semiconductor stack SS, to be in parallel to the semiconductor stack SS, and the third group PG3 may disposed on the other side of the semiconductor stack SS, to be in parallel to the semiconductor stack SS. Additionally or alternatively, the first group PG1 may be disposed closer to the semiconductor stack SS than the second group PG2 and the third group PG3, and the third group PG3 may be disposed closer to the semiconductor stack SS than the second group PG2.

Figure 6:
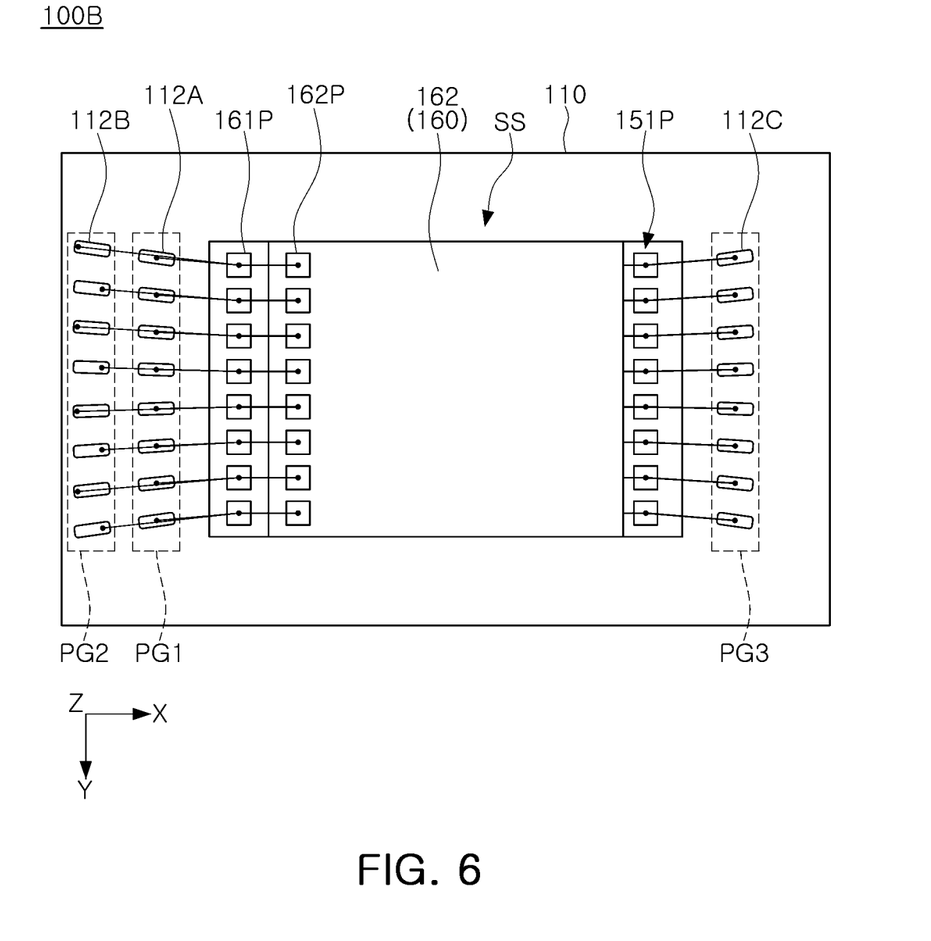
FIG. 6 is a diagram illustrating a modified example.

The substrate pad 112 may be a bonding finger elongated in an X direction. For example, the substrate pad 112 may be formed on the first surface S1 of the package substrate 110 to a length of about 200 to 300 micrometers (µm). Additionally or alternatively, the substrate pad 112 may be disposed at a pitch of about 65 nanometers (nm) or less. In some embodiments, the pitches of the substrate pads 112 may be the same. However, the present disclosure is not limited thereto, and as illustrated in FIG. 6, the substrate pads 112 included in the groups PG of the semiconductor package 100B may be aligned in a direction toward the semiconductor stack SS, and a pitch of the substrate pads 112 included in the groups PG may be different. For example, the pitch of the first substrate pads 112A may be smaller than the pitch of the second substrate pads 112B.

The bump pad 113 may be disposed on the second surface S2 of the package substrate 110, and a conductive bump 120 may be attached to the bump pad 113. For example, the conductive bump 120 may have a land, ball, and/or pin shape.

The semiconductor stack SS may be disposed on the first surface S1 of the package substrate 110. For example, the semiconductor stack SS may have a structure in which a first chip stack 140, a second chip stack 160, and a third chip stack 150 are stacked. According to an example embodiment, the third chip stack 150 may be disposed between the first chip stack 140 and the second chip stack 160, and two semiconductor chips may be disposed in each chip stack (e.g., first chip stack 140, second chip stack 160, and third chip stack 150) as illustrated in FIGS. 1 and 2. However, the number of chip stacks included in the semiconductor stack SS and the number of semiconductor chips included in each chip stack may be variously modified without deviating from the scope of the present disclosure. For example, the semiconductor stack SS may include more (e.g., seven) chip stacks or less chip stacks (e.g., two). In another example, the first chip stack 140, the second chip stack 160, and the third chip stack 150 may each include more (e.g., four) semiconductor chips.

Continuing to refer to FIG. 2, the first chip stack 140 may include first semiconductor chips 141 and 142, the second chip stack 160 may include second semiconductor chips 161 and 162, and the third chip stack 150 may include third semiconductor chips 151 and 152. In some embodiments, the number of semiconductor chips included each of the first chip stack 140, the second chip stack 160, and the third chip stack 150 may be the same. However, the present disclosure is not limited thereto, and the number of the first semiconductor chips 141 and 142, the number of the second semiconductor chips 161 and 162, and the number of the third semiconductor chips 151 and 152 may be different from each other.

An upper surface of the second semiconductor chip 162 disposed in a lowermost portion of the second chip stack 160 may be spaced apart from the first surface S1 of the package substrate 110 by a predetermined distance. Alternatively or additionally, the upper surface of the second semiconductor chip 162 may be spaced apart from the first surface S1 of the package substrate 110 by more than the predetermined distance. For example, the predetermined distance may be at least 800 μm. In another example, the predetermined distance may be about 845 μm.

In some embodiments, each of the first semiconductor chips 141 and 142, the second semiconductor chips 161 and 162, and the third semiconductor chips 151 and 152 may be the same type of semiconductor chip having the same size. For example, the first semiconductor chips 141 and 142, the second semiconductor chips 161 and 162, and the third semiconductor chips 151 and 152 may be memory chips of the same type and may be memory chips having the same capacity. For example, the semiconductor chips may be memory chips and may include, but not be limited to, phase change random access memory (PRAM), resistive random access memory (RRAM), magnetic random access memory (MRAM), dynamic random access memory (DRAM), a flash memory device, and the like. However, the present disclosure is not limited thereto, and a portion of the first semiconductor chips 141 and 142, the second semiconductor chips 161 and 162, and the third semiconductor chips 151 and 152 may be heterogeneous semiconductor chips. Alternatively or additionally, the sizes of the first semiconductor chips 141 and 142, the sizes of the second semiconductor chips 161 and 162, and the sizes of the third semiconductor chips 151 and 152 may be different from each other.

The first chip stack 140, the second chip stack 160, and the third chip stack 160 may be formed in a cascade structure in which each of the first semiconductor chips 141 and 142, the second semiconductor chips 161 and 162, and third semiconductor chips 151 and 152 are stacked in a step shape. That is, the second chip stack 160 and third chip stack 150 may have an overhang (e.g., OH of FIG. 2) region in which lower semiconductor chips 151 and 161 of each of the second and third chip stacks 160 and 150 protrude further outwardly than side surfaces of uppermost semiconductor chips 142 and 152 disposed therebelow. That is, the overhang OH region disposed thereabove may not be supported by a chip stack disposed therebelow, and may be defined as a region protruding in an X-axis direction.

Each of the first semiconductor chips 141 and 142, the second semiconductor chips 161 and 162, and the third semiconductor chips 151 and 152 may be adhered to each other by adhesive members 141F, 142F, 151F, 152F, 161F, and 162F, respectively, and may be fixed. The adhesive members 141F, 142F, 151F, 152F, 161F, and 162F may be die attach films.

Figure 5A:
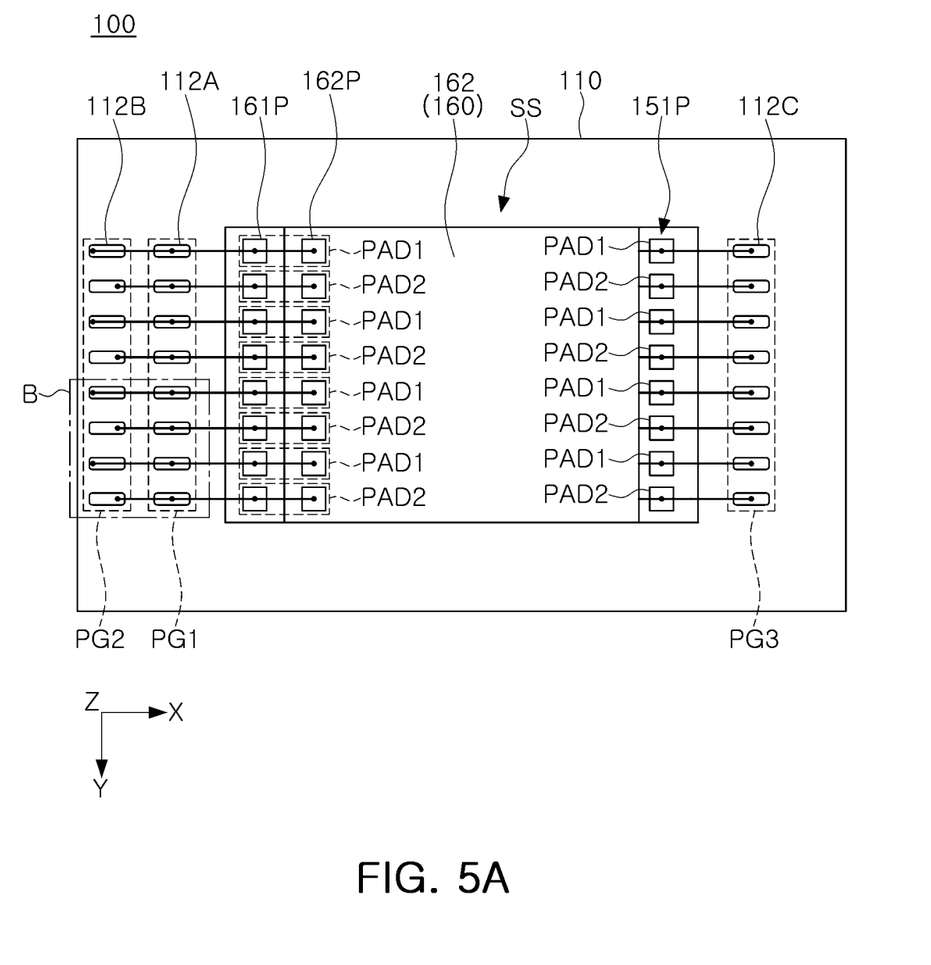
FIG. 5A is a plan view of a semiconductor package as viewed in a Z-axis direction of FIG. 1.

The first semiconductor chips 141 and 142, the second semiconductor chips 161 and 162, and the third semiconductor chips 151 and 152 may be disposed in any one corner region of each of corners thereof in a Y-axis direction, so that chip pads to which bonding wire are respectively connected are adjacent thereto. The chip pads 141P, 142P, 151P, 152P, 161P, and 162P may be arranged in rows in the Y-axis direction, and may be disposed to be spaced apart from each other at regular intervals. The chip pads 141P, 142P, 151P, 152P, 161P, and 162P may include a ground/power pad PAD1 and an input/output pad PAD2, as shown in FIG. 5A. According to an example embodiment, a single-ended signal may be input/output through the input/output pad PAD2. The ground/power pad PAD1 and the input/output pad PAD2 may be alternately disposed in the Y-axis direction.

The bonding wire BW may electrically connect (e.g., couple) the substrate pad 112 of the package substrate 110 and the semiconductor stack SS to each other. Alternatively or additionally, the bonding wire BW may electrically connect semiconductor chips included in the semiconductor stack SS to each other. In an example embodiment, a diameter of the bonding wires BW may be about 0.7 mil. For the sake of brevity and clarity, only the first bonding wire BW1 and the second bonding wire BW2, which may be respectively connected to the first chip stack 140 and the second chip stack 160, are described. A third bonding wire BW3, which may be connected to the third chip stack 150, may have a similar configuration to the first bonding wire BW1 and, as such, a detailed description thereof is omitted.

The bonding wire BW may be referred to as a lower bonding wire and an upper bonding wire, respectively, depending on the position of the chip stack to be bonded. That is, for example, a first bonding wire BW1 connected to the first chip stack 140, which may be disposed relatively lower than the second chip stack 160 or the third chip stack 150, may be referred to as a lower bonding wire BW1, and a second bonding wire BW2 connected to the second chip stack 160, which may be disposed relatively higher than the first chip stack 140, may be referred to as an upper bonding wire BW2.

Figure 3:
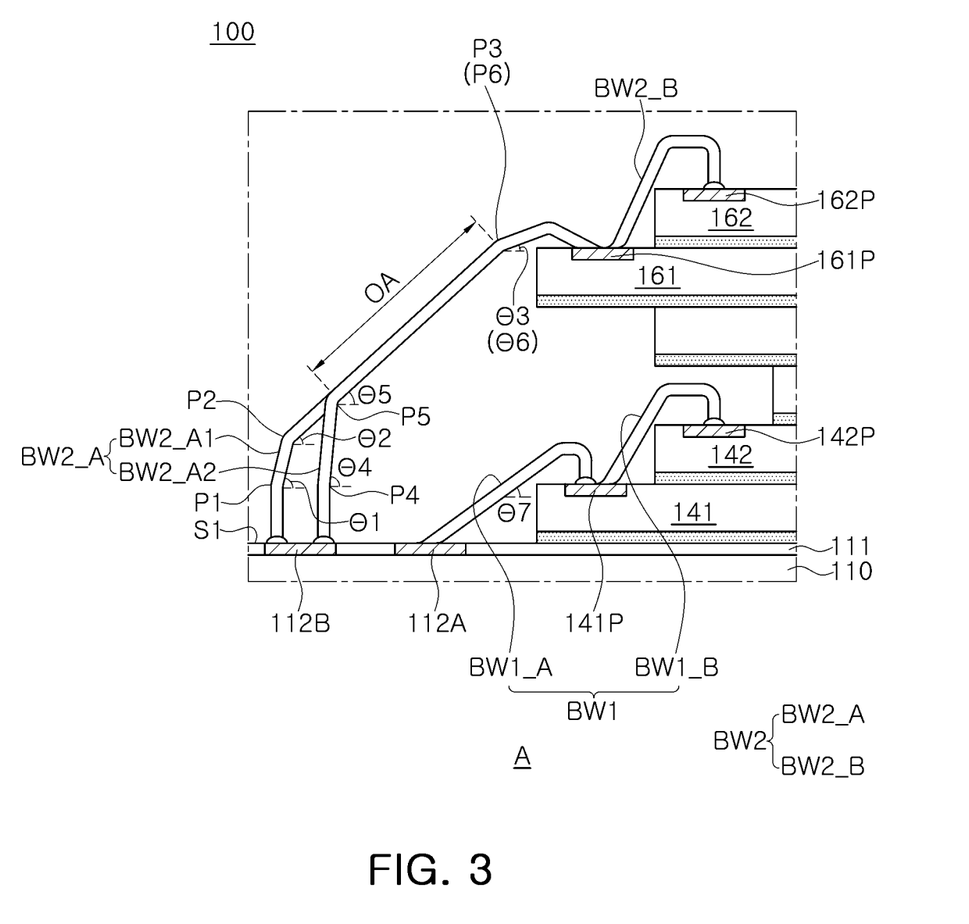
FIG. 3 is an enlarged view of part A of FIG. 2.

Referring to FIG. 3, the lower bonding wire BW1 may include a chip-to-substrate lower bonding wire BW1_A and an inter-chip lower bonding wire BW1_B. The chip-substrate lower bonding wire BW1_A may electrically connect the lowermost semiconductor chip 141 included in the first chip stack 140 to the package substrate 110. The inter-chip lower bonding wire BW1_B may electrically connect the semiconductor chips 141 and 142 included in the first chip stack 140 to each other.

The chip-substrate lower bonding wire BW1_A may electrically connect the package substrate 110 and the lowermost first semiconductor chip 141 of the first chip stack 140. That is, the chip-substrate lower bonding wire BW1_A may electrically connect a chip pad 141P of the lowermost first semiconductor chip 141 included in the first chip stack 140 and the first substrate pad 112A of the package substrate 110 to each other. Consequently, an electrical signal may be transmitted between the package substrate 110 and the lowermost first semiconductor chip 141, through the chip-substrate lower bonding wire BW1_A.

The inter-chip lower bonding wire BW1_B may connect the first semiconductor chips 141 and 142 to each other. Consequently, an electrical signal may be transmitted between the first semiconductor chips 141 and 142, through the inter-chip lower bonding wire BW1_B. Alternatively or additionally, the electrical signal transmitted from the package substrate 110 through the chip-substrate lower bonding wire BW1_A may be transmitted to the uppermost first semiconductor chip 142 through the inter-chip lower bonding wire BW1_B.

The chip-to-substrate lower bonding wire BW1_A and the inter-chip lower bonding wire BW1_B may be bonded by a forward bonding method. For example, the chip-to-substrate lower bonding wire BW1_A may be connected by bonding one end of the chip-substrate lower bonding wire BW1_A to the first chip pad 141P of the first semiconductor chip 141 by ball bonding, and then bonding the other end of the chip-substrate lower bonding wire BW1_A to the first substrate pad 112A of the package substrate 110 by stitch bonding. Alternatively or additionally, the inter-chip lower bonding wire BW1_B may be connected by bonding one end of the inter-chip lower bonding wire BW1_B to the first chip pad 142P of the uppermost first semiconductor chip 142 by ball bonding, and then bonding the other end of the inter-chip lower bonding wire BW1_B to the chip pad 141P of the lowermost first semiconductor chip 141 by stitch bonding.

The upper bonding wire BW2 may include a chip-to-substrate upper bonding wire BW2_A and an inter-chip upper bonding wire BW2_B. The chip-to-substrate upper bonding wire BW2_A may be referred to as a first upper bonding wire, and the inter-chip upper bonding wire BW2_B may be referred to as a second upper bonding wire. The chip-substrate upper bonding wire BW2_A may electrically connect the lowermost semiconductor chip 161 included in the second chip stack 160 to the package substrate 110. The inter-chip upper bonding wire BW2_B may electrically connect the semiconductor chips 161 and 162 included in the second chip stack 160 to each other.

The inter-chip upper bonding wire BW2_B may connect the second semiconductor chips 161 and 162 to each other. Consequently, an electrical signal may be transmitted between the second semiconductor chips 161 and 162 through the inter-chip lower bonding wire BW2_B. Alternatively or additionally, the electrical signal transmitted from the package substrate 110 through the chip-to-substrate upper bonding wire BW2_A may be transmitted to the second semiconductor chips 161 and 162, through the inter-chip upper bonding wire BW2_B.

The chip-substrate upper bonding wire BW2_A may electrically connect the package substrate 110 and the lowermost second semiconductor chip 161 of the second chip stack 160. That is, the chip-substrate upper bonding wire BW2_A may electrically connect the second substrate pad 112B of the package substrate 110 and a chip pad 161P of the lowermost second semiconductor chip 161 included in the second chip stack 160 to each other. Consequently, an electrical signal may be transmitted between the package substrate 110 and the lowermost second semiconductor chip 161, through the chip-substrate upper bonding wire BW2_A.

In some embodiments, the chip-substrate upper bonding wire BW2_A may be bonded by a reverse bonding method. For example, the chip-substrate upper bonding wire BW2_A may be connected by bonding one end of the chip-substrate upper bonding wire BW2_A to the second substrate pad 112B of the package substrate 110 by ball bonding, and then bonding the other end of the chip-substrate upper bonding wire BW2_A to the chip pad 161P of the second semiconductor chip 161 by stitch bonding. Alternatively or additionally, the lower bonding wire BW1 and the inter-chip upper bonding wire BW2_B may be bonded by a forward bonding method. For example, the inter-chip upper bonding wire BW2_B may be connected by bonding one end of the inter-chip upper bonding wire BW2_B to the second chip pad 162P of the uppermost second semiconductor chip 162 by ball bonding, and then bonding the other end of the inter-chip upper bonding wire BW2_B to the second chip pad 162P of the lowermost second semiconductor chip 161 by stitch bonding.

That is, in the semiconductor package 100, according to an example embodiment, the chip-substrate upper bonding wire BW2_A may be bonded by a reverse bonding method, and other bonding wires may be bonded by a forward bonding method.

The forward bonding method may have an advantage of high productivity, compared to the reverse bonding method, by connecting an object to be connected with a shortest distance. However, when objects with a large height difference are bonded to each other using the forward bonding method, in a process of bonding at a chip pad and then extending the same in a direction of a substrate pad, a loop of the bonding wire is inclined to the side, which may cause a short circuit by being in contact with other bonding wires that have already been bonded. Since the chip-substrate upper bonding wire BW2_A of an example embodiment bonds between the second substrate pad 112B of the package substrate 110 and the lowermost second semiconductor chip 161 having a large height difference, when using a forward bonding method, a problem in which the loop of the chip-substrate upper bonding wire BW2_A is inclined to the side may be solved.

The chip-substrate upper bonding wire BW2_A may include a first chip-substrate upper bonding wire BW2_A1, and a second group chip-substrate upper bonding wire BW2_A2, depending on a position that the first chip-substrate upper bonding wire BW2_A1 and the chip-substrate upper bonding wire BW2_A2 are connected to the second substrate pad 112B. For example, the first chip-substrate upper bonding wire BW2_A1 may be connected to a ground/power pad PAD1, and the second chip-substrate upper bonding wire BW2_A2 may be connected to an input/output pad PAD2. However, the present disclosure is not limited thereto, and the first chip-substrate upper bonding wire BW2_A1 may be connected to the input/output pad PAD2, and the second chip-substrate upper bonding wire BW2_A2 may be connected to the ground/power pad PAD1.

Figure 5B:
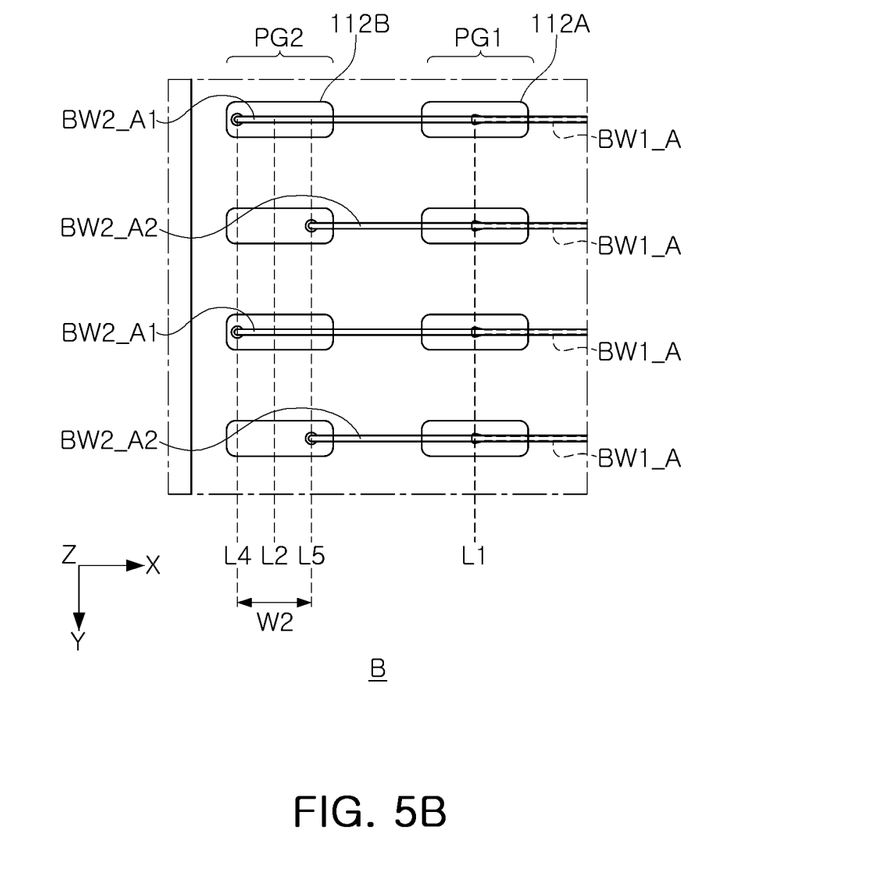
FIG. 5B is an enlarged view of part B of FIG. 5A.

Referring to FIG. 5B, the first chip-to-substrate upper bonding wire BW2_A1 and the second chip-to-substrate upper bonding wire BW2_A2 may be alternately disposed in a Y-direction, and may be alternately connected to the second substrate pad 112B. That is, an end portion of the first chip-to-substrate upper bonding wire BW2_A1 and an end portion of the second chip-to-substrate upper bonding wire BW2_A2 may be arranged in a zigzag manner. In some embodiments, a length of the first chip-to-substrate upper bonding wire BW2_A1 may be longer than a length of the second chip-to-substrate upper bonding wire BW2_A2.

One end of the first chip-substrate upper bonding wire BW2_A1 and one end of the second chip-substrate upper bonding wire BW2_A2 may be respectively bonded by ball bonding along a virtual fourth straight line L4 and a fifth straight line L5, parallel to a second straight line L2 in which a second group PG2 of the substrate pad 112 is disposed. For example, one end of the first chip-to-substrate upper bonding wire BW2_A1 may be disposed on the fourth straight line L4, and one end of the second chip-to-substrate upper bonding wire BW2_A2 may be disposed on the fifth straight line L5. For example, the fourth straight line L4 and the fifth straight line L5 may be spaced apart from each other by an interval W2 of about 90 to 110 µm.

As described above, when the chip-substrate upper bonding wire BW2_A is bonded by a reverse bonding method, a problem in which a loop of the chip-substrate upper bonding wire BW2_A is inclined to the side may be solved. However, when a pitch of the second substrate pad 112B is small, in a process of forming ball bonding on the second substrate pad 112B, a capillary ejecting the bonding wire may come into contact with an adjacent bonding wire, so that there may be a problem in which a loop of the adjacent bonding wire is deformed. In an example embodiment, by alternately arranging one end of the first chip-to-substrate upper bonding wire BW2_A1 and one end of the second chip-to-substrate upper bonding wire BW2_A2 to the second substrate pad 112B to each other, it may be possible to solve the problem in which the capillary is in contact with the adjacent bonding wire.

Figure 4:
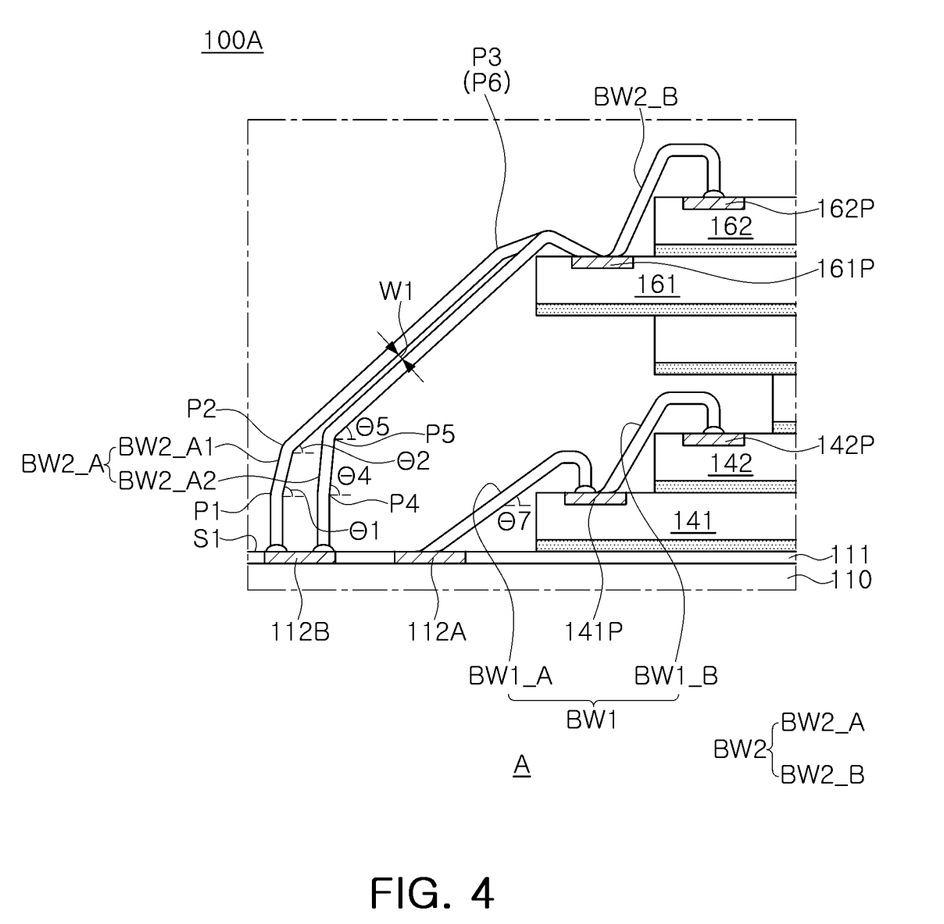
FIG. 4 is a view illustrating a modified example.

Referring to FIG. 3, a loop of the first chip-to-substrate upper bonding wire BW2_A1 and a loop of the second chip-to-substrate upper bonding wire BW2_A2 may have a region arranged parallel to each other on a coplanar surface. However, the loop of the first chip-to-substrate upper bonding wire BW2_A1 and the loop of the second chip-to-substrate upper bonding wire BW2_A2 do not have to be completely parallel. For example, as illustrated in FIG. 4, it may be sufficient that the loop of the first chip-to-substrate upper bonding wire BW2_A1 of the semiconductor package 100A and the second chip-to-substrate upper bonding wire BW2_A2 are disposed within a predetermined interval W1. For example, the predetermined distance W1 may be twice the tolerance range of the manufacturing process, and may be about 60 µm.

The chip-substrate upper bonding wire BW2_A may be bent to electrically connect the second substrate pad 112B of the package substrate 110 and the chip pad 161P of the lowermost second semiconductor chip 161 included in the second chip stack 160 to each other. The first chip-substrate upper bonding wire BW2_A1 and the second chip-substrate upper bonding wire BW2_A2 may be bent n times, and then stitch-bonded to the chip pad 161P of the second semiconductor chip 161, where n is an integer greater than 0. That is, the chip-substrate upper bonding wire BW2_A may be bent n times until it reaches the same level as an upper surface of the chip pad 161P of the lowermost second semiconductor chip 161 included in the second chip stack 160. In an example embodiment, the chip-substrate upper bonding wire BW2_A may be bent three times until it reaches a level of the chip pad 161P of the second lowest semiconductor chip 161 included in the second chip stack 160.

In some embodiments, the first chip-substrate upper bonding wire BW2_A1 and the second chip-substrate upper bonding wire BW2_A2 may have the same number of times of being bent (e.g., n is the same), and/or may have partially different positions of being bent.

For example, referring to FIG. 3, the first chip-to-substrate upper bonding wire BW2_A1 is ball-bonded on the second substrate pad 112B and then extends upwardly, and may be sequentially refracted at a first angle $\theta 1$ in a first position P1, at a second angle $\theta 2$ in a second position P2, and at a third angle $\theta 3$, in a third position P3.

Alternatively or additionally, the second chip-substrate upper bonding wire BW2_A2 may be ball-bonded to the second substrate pad 112B and then extend upwardly, and may be sequentially bent at a fourth angle $\theta 4$ in a fourth position P4, at a fifth angle $\theta 5$ in a fifth position P5, and at a sixth angle $\theta 6$ in a sixth position P6. The first position P1 may be at the same level as the fourth position P4, and the third position P3 may be substantially at the same level as the sixth position P6. Alternatively or additionally, the second position P2 may be on a level lower than that of the fifth position P5. The first angle $\theta 1$ may be greater than the second angle $\theta 2$. The second angle $\theta 2$ may be substantially the same as the fifth angle $\theta 5$, and the third angle $\theta 3$ may be substantially the same as the sixth angle 96.

Accordingly, since the first chip-to-substrate upper bonding wire BW2_A1 and the second chip-to-substrate upper bonding wire BW2_A2 may be disposed to be in parallel to each other in a region, higher than the second position P2 of the second chip-substrate upper bonding wire BW2_A2, a length of the region OA in which the first chip-substrate upper bonding wire BW2_A1 and the second chip-substrate upper bonding wire BW2_A2 are parallel to each other may be maximized.

As described above, the first chip-substrate upper bonding wire BW2_A1 may be connected to a ground/power pad PAD1, and the second chip-to-substrate upper bonding wire BW2_A2 may be connected to an input/output pad PAD2. In this case, when a loop shape of the first chip-substrate upper bonding wire BW2_A1 and a loop shape of the second chip-substrate upper bonding wire BW2_A2 are different, a phenomenon in which crosstalk of a signal transmitted through the input/output pad with a signal transmitted through the adjacent input/output pad may occur. In this case, a problem in that the signal transmitted through the input/output pad is deteriorated may occur. For example, when crosstalk occurs, it may be measured that about 5.3 dB of deterioration occurs in the signal transmitted through the input/output pad PAD2. In an example embodiment, by disposing the loop shape of the first chip-substrate upper bonding wire BW2_A1 and the loop shape of the second chip-substrate upper bonding wire BW2_A2 side by side within a tolerance range, it may be possible to prevent the signal transmitted through the input/output pad PAD2 from being deteriorated. In an example embodiment, it may be determined that near end crosstalk (NEXT) may improve from −17.5 dB to −21.8 dB, and that far end crosstalk (FEXT) may improve from −21.5 dB to −23.3 dB.

The encapsulant 170 may be disposed on the package substrate 110, and may cover a semiconductor stack SS. The encapsulant 170 may include an insulating material, for example, a thermosetting resin such as an epoxy resin, a thermoplastic resin such as polyimide, or a prepreg including an inorganic filler and/or glass fiber, an Ajinomoto Build-up Film (ABF), FR-4, Bismaleimide Triazine (BT), EMC, and the like.

As set forth above, according to the present disclosure, by matching a loop shape of bonding wires connected to a ground/power pad and an input/output pad, a semiconductor package in which deterioration of a signal transmitted through the bonding wire connected to the input/output pad is reduced may be provided.

Various and advantageous advantages and effects of the present disclosure are not limited to the above description, and will be more readily understood in the process of describing the specific embodiments of the present disclosure.

While the example embodiments have been shown and described above, it will be apparent to those skilled in the art that modifications and variations could be made without departing from the scope of the present disclosure as defined by the appended claims.

What is claimed is:

1. A semiconductor package, comprising:
    a package substrate that includes:
        a first surface;
        a second surface that is opposite to the first surface;
        first substrate pads disposed on the first surface in a first row; and
        second substrate pads disposed on the first surface in a second row, wherein the second row is parallel to the first row in a first direction;
    a first semiconductor chip, disposed on the first surface of the package substrate, that includes first chip pads;
    lower bonding wires configured to respectively couple the first chip pads and the first substrate pads, the lower bonding wires being ball-bonded to the first chip pads and being stich-bonded to the first substrate pads;
    a second semiconductor chip, disposed on the first semiconductor chip, that includes second chip pads;
    upper bonding wires configured to respectively couple the second chip pads and the second substrate pads, the upper bonding wires being stich-bonded to the second chip pads and being ball-bonded to the second substrate pads; and
    an encapsulant disposed on the package substrate and covering the first semiconductor chip and the second semiconductor chip,
    wherein the upper bonding wires include first upper bonding wires and second upper bonding wires alternately disposed in the first direction,
    the second upper bonding wires are coupled to the second substrate pads in a coupling position that is closer to the first semiconductor chip than to the first upper bonding wires,
    the second chip pads include a ground/power pad and an input/output pad,
    the first upper bonding wires are coupled to the ground/power pad,
    the second upper bonding wires are coupled to the input/output pad, and
    the input/output pad is configured to input a first single-ended signal and output a second single-ended signal.

2. The semiconductor package of claim 1, wherein an upper surface of the second semiconductor chip is spaced apart from the first surface of the package substrate by at least 800 μm.

3. The semiconductor package of claim 1, wherein
    a first size of the first semiconductor chip is substantially equal to a second size of the second semiconductor chip, and
    the second semiconductor chip is disposed to overlap the first semiconductor chip.

4. The semiconductor package of claim 1, wherein a first type of the first semiconductor chip matches a second type of the second semiconductor chip.

5. The semiconductor package of claim 1, wherein
    the first upper bonding wires are disposed in a first straight line,
    the second upper bonding wires are disposed in a second straight line,
    the second straight line is parallel to the first straight line in the first direction, and
    the first straight line and the second straight line are spaced apart from each other at intervals of 90 μm to 110 μm.

6. The semiconductor package of claim 1, wherein
    each of the first upper bonding wires extends from the second substrate pads upwardly, and is sequentially bent toward the second semiconductor chip, with respect to the first surface of the package substrate, at a first angle in a first position, at a second angle in a second position, and at a third angle in a third position,
    each of the second upper bonding wires extends from the second substrate pads upwardly, and is sequentially bent toward the second semiconductor chip, with respect to the first surface of the package substrate, at a fourth angle in a fourth position, at a fifth angle in a fifth position, and at a sixth angle in a sixth position,
    a first level of the first position is substantially equal to a fourth level of the fourth position,
    a third level of the third position is substantially equal to a sixth level of the sixth position, and
    a second level of the second position is lower than a fifth level of the fifth position.

7. The semiconductor package of claim 6, wherein
    the third angle is narrower than the second angle, and the second angle is narrower than the first angle,
    the sixth angle is narrower than the fifth angle, and the fifth angle is narrower than the fourth angle,
    the first angle is narrower than the fourth angle,
    the second angle is substantially equal to the fifth angle, and
    the third angle is substantially equal to the sixth angle.

8. The semiconductor package of claim 1, wherein a first pitch of the first substrate pads is smaller than a second pitch of the second substrate pads.

9. The semiconductor package of claim 1, wherein the lower bonding wires are further configured to connect a space between a first level at which the first substrate pads are disposed and a second level at which the first chip pads are disposed with a shortest distance.

10. The semiconductor package of claim 1, wherein a length of each of the first upper bonding wires is longer than a length of each of the second upper bonding wires.

11. A semiconductor package, comprising:
    a package substrate that includes:
        a first surface;
        a second surface that is opposite to the first surface first substrate pads disposed on the first surface in a first row; and second substrate pads disposed on the first surface in a second row that is parallel to the first row in a first direction;

a first semiconductor stack, disposed on the first surface of the package substrate, that includes at least two first semiconductor chips stacked in a step shape, each of the at least two first semiconductor chips having first chip pads disposed adjacently in one side edge of each of the at least two first semiconductor chips;

a second semiconductor stack, disposed on the first semiconductor stack, that includes at least two second semiconductor chips stacked in a step shape, and having an overhang region protruding outwardly of an uppermost first semiconductor chip of the first semiconductor stack in a direction perpendicular to the first substrate of the package substrate, the at least two second semiconductor chips having second chip pads disposed adjacently in one side edge of each of the at least two second semiconductor chips;

lower bonding wires configured to couple the package substrate to a lowermost first semiconductor chip of the first semiconductor stack;

upper bonding wires configured to couple the package substrate to a lowermost second semiconductor chip of the second semiconductor stack; and an encapsulant disposed on the package substrate and covering the first semiconductor stack and the second semiconductor stack, wherein the upper bonding wires include a first group and a second group alternately disposed with each other, the second group being coupled to the second substrate pads in a coupling position that is closer to the first semiconductor stack than to the first group, the second chip pads include a ground/power pad and an input/output pad, the first group is coupled to the ground/power pad, and the second group is coupled to the input/output pad.

12. The semiconductor package of claim 11, wherein the input/output pad is configured to input a first single-ended signal and output a second single-ended signal.

13. The semiconductor package of claim 11, wherein one end of the lower bonding wires is stitch-bonded to the first substrate pads, an opposite end of the lower bonding wires is ball-bonded to the first chip pads, one end of the upper bonding wires is ball-bonded to the second substrate pads, and an opposite end of the upper bonding wires is stitch-bonded to the second chip pads.

14. The semiconductor package of claim 11, wherein an upper surface of the lowermost second semiconductor chip is spaced apart from the first surface of the package substrate by at least 800 µm.

15. The semiconductor package of claim 11, wherein the first group is disposed in a first straight line, the second group is disposed in a second straight line, the second straight line is parallel to the first straight line in the first direction, the first straight line and the second straight line are spaced apart from each other at intervals of 90 µm to 110 µm.

16. The semiconductor package of claim 11, wherein each of the first group extends from the second substrate pads upwardly, and is sequentially bent toward the second semiconductor stack with respect to the first surface of the package substrate, at a first angle in a first position, at a second angle in a second position, and at a third angle in a third position, each of the second group extends from the second substrate pads upwardly, and is sequentially bent toward the second semiconductor stack with respect to the first surface of the package substrate, at a fourth angle in a fourth position, at a fifth angle in a fifth position, and at a sixth angle in a sixth position, a first level of the first position is substantially equal to a fourth level of the fourth position, a third level of the third position is substantially equal to a sixth level of the sixth position, a second level of the second position is lower than a fifth level of the fifth position, the third angle is narrower than the second angle, and the second angle is narrower than the first angle, the sixth angle is narrower than the fifth angle, and the fifth angle is narrower than the fourth angle, the first angle is narrower than the fourth angle, the second angle is substantially equal to the fifth angle, and the third angle is substantially equal to the sixth angle.

17. The semiconductor package of claim 11, wherein a first size of the lowermost first semiconductor chip is substantially equal to a second size of the lowermost second semiconductor chip, and the lowermost second semiconductor chip is disposed to overlap the lowermost first semiconductor chip.

* * * * *